US012644920B2

(12) United States Patent
Schmidtlein et al.

(10) Patent No.: US 12,644,920 B2
(45) Date of Patent: Jun. 2, 2026

(54) METHOD FOR DETERMINING WEAR IN AN ELECTRONIC UNIT, AND TEST APPARATUS

(71) Applicant: Robert Bosch GmbH, Stuttgart (DE)

(72) Inventors: Andreas Schmidtlein, Tamm (DE); Simeon Lange, Mundelsheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 184 days.

(21) Appl. No.: 18/556,158

(22) PCT Filed: Apr. 29, 2022

(86) PCT No.: PCT/EP2022/061518
§ 371 (c)(1),
(2) Date: Oct. 19, 2023

(87) PCT Pub. No.: WO2022/233730
PCT Pub. Date: Nov. 10, 2022

(65) Prior Publication Data
US 2024/0210465 A1 Jun. 27, 2024

(30) Foreign Application Priority Data

May 5, 2021 (DE) ..................... 10 2021 204 551.0

(51) Int. Cl.
*G01R 31/28* (2006.01)
*G01R 31/26* (2020.01)
(52) U.S. Cl.
CPC ..... *G01R 31/2817* (2013.01); *G01R 31/2642* (2013.01)
(58) Field of Classification Search
CPC .............. G01R 29/0878; G01R 31/002; G01R 31/319; G01R 33/422; G01R 29/0814;
(Continued)

(56) References Cited

U.S. PATENT DOCUMENTS 6,717,428 B1 * 4/2004 Spica ................. G01R 31/2837
324/762.01
7,002,359 B2 * 2/2006 Kahng ................. H05K 9/0069
324/613
(Continued)

FOREIGN PATENT DOCUMENTS

DE     102015225909 A1     6/2017
EP         0990916 A1     4/2000
(Continued)

OTHER PUBLICATIONS

International Search Report for PCT/EP2022/061518, Issued Sep. 1, 2022.

*Primary Examiner* — Vinh P Nguyen
(74) *Attorney, Agent, or Firm* — NORTON ROSE FULBRIGHT US LLP

(57) ABSTRACT

A method for determining wear in an electronic unit, in particular a power electronics unit, which includes at least one electronic component, in particular a semiconductor component, capacitor or the like. The unit is subjected to a test procedure in which at least two predefinable electrical load cycles are applied to the unit, in which cycles the unit is operated in each case in order to simulate at least one selected operating mode for a predefined period of time. During the test procedure, electromagnetic waves generated by the unit by an electrical load resulting from the application of the at least two load cycles to the unit are detected for at least two of the load cycles, and the detected electromagnetic waves of the at least two load cycles are compared with one another in order to detect wear in the unit.

11 Claims, 2 Drawing Sheets

(58) Field of Classification Search
CPC .............. G01R 33/3635; G01R 33/345; G01R
31/001; G01R 31/2822; G01R 33/543;
G01R 33/5659; G01R 29/14; G01R
33/3607; G01R 23/00; G01R 23/02;
G01R 31/2642; G01R 31/2817; H04W
24/00; H04W 24/06
See application file for complete search history.

(56) References Cited

U.S. PATENT DOCUMENTS

| | | | |
|---|---|---|---|
| 9,091,716 B2 * | 7/2015 | Kim | G01R 29/0871 |
| 9,494,633 B2 * | 11/2016 | Yeo | G01R 31/002 |
| 10,624,612 B2 * | 4/2020 | Sumi | G01N 29/0654 |
| 10,782,336 B2 * | 9/2020 | Jenkins | G01R 31/2642 |
| 11,668,741 B2 * | 6/2023 | Hyoung | G01R 29/105 |
| | | | 324/612 |
| 2008/0177486 A1 | 7/2008 | Farkas | |
| 2015/0002025 A1 | 1/2015 | Maricic et al. | |
| 2017/0276728 A1 | 9/2017 | Jenkins et al. | |
| 2018/0313877 A1 | 11/2018 | Brant et al. | |

FOREIGN PATENT DOCUMENTS

| | | | |
|---|---|---|---|
| EP | 2584679 A2 | 4/2013 | |
| JP | 2006156978 A | 6/2006 | |

* cited by examiner

METHOD FOR DETERMINING WEAR IN AN ELECTRONIC UNIT, AND TEST APPARATUS

FIELD

The present invention relates to a method for determining wear in an electronic unit, in particular a power electronics unit, which comprises at least one electronic component, in particular a semiconductor component, capacitor or the like, wherein the unit is subjected to a test procedure in which at least two electrical load cycles are applied to the unit, in which cycles the unit is operated for a predefined period of time in each case in order to simulate at least one selected operating mode.

Furthermore, the present invention relates to a test apparatus for determining wear in an electronic unit, in particular a power electronics unit, which comprises at least one electronic component, in particular a semiconductor component, capacitor or the like, comprising at least one device for applying at least two predefinable electrical load cycles to the unit, comprising at least one measuring device for detecting electromagnetic waves of the unit caused by the at least two load cycles, and comprising at least one control device for controlling the test apparatus and for evaluating the electromagnetic waves detected by the measuring device.

BACKGROUND INFORMATION

Methods and apparatuses of the type mentioned above are described in the related art. In order to detect wear in electrical/electronic units, it is conventional to subject the units to an electrical test procedure in which at least one predefinable load cycle, usually several load cycles, is applied to the unit. Within the scope of this load cycle, the unit is operated under specifically selected conditions or with defined specifications for a predetermined period of time. It is thus conventional, for example, to simulate normal operation of the unit by means of the load cycle or to subject the unit to maximum load and stress. Since wear in the unit itself cannot be seen directly, in particular not when it is a part of a larger assembly, determination of wear entails a relatively high effort, since the unit often needs to be disassembled as well in order to be able to check visually, for example, electrical contact points or the like. This time-consuming disassembly also leads to fault locations only being discovered late and development time thereby being extended. In addition, wear can arise which at least initially does not impair the functioning of the unit, and therefore by a purely visual check it cannot be decided whether the detected wear is impairing the functioning of the unit or, for example, whether it will soon do so. In the case of components of the power electronics unit, such as semiconductor switches, power diodes and capacitors, with such wear, although the respective operating parameters change, the functioning of the unit is not impaired, however, until a functional failure occurs.

SUMMARY

The present invention with the features disclosed herein may have an advantage that wear in the unit can be reliably detected even during the test procedure. In this respect, the method according to the present invention enables an early determination of wear. In addition, disassembly of the unit for analyzing the wear is not necessary, and therefore the method can be carried out with little effort and thus inexpensively.

According to an example embodiment of the present invention, it is provided that, during the test procedure, electromagnetic waves generated by the unit by an electrical load resulting from application of the at least two load cycles to the unit are detected for at least two of the load cycles, and that the detected electromagnetic waves of the at least two load cycles are compared with one another in order to detect wear in the unit. In the context of the present invention, electrical load is in particular to be understood to mean at least one ascertainable or detectable operating variable, for example a gross or net power, a percentage of a maximum possible capacity utilization of the unit, an operating current, an operating voltage, an operating temperature, or the like. Furthermore, in the context of the present invention, electrical load cycles are to be understood in each case to mean operating the unit under selected conditions or with defined specifications for a predetermined period of time in order to simulate at least one operating mode of the unit. In particular, the unit has a plurality of in particular different types of components which each generate at least one of the electromagnetic waves as a result of the electrical load. Changes in the electromagnetic waves over the period of the test procedure can be detected by the comparison. On the basis of these changes, incipient wear in the unit or in the components can be detected. The electrical load preferably corresponds to a normal load arising as a result of intended operation of the unit. As a result, a reliable simulation of the intended operation, i.e., of a normal operation, of the unit is made possible within the scope of the test procedure.

According to a preferred development of the present invention, it is provided that an electromagnetic spectrum of the waves of each load cycle is determined from the electromagnetic waves of the at least two load cycles, and these determined spectra are compared with one another in order to detect wear. In this respect, each electromagnetic spectrum is composed of a plurality of electromagnetic waves from the unit, and represents an individual, i.e., characteristic, identification feature of the unit in question, a fingerprint, so to speak, of the unit. Wear in individual components of the unit is reflected in a change in the spectrum that is characteristic of the component experiencing wear. For example, wear in a first component leads to a change in the spectrum that is different from wear in a second component. In this respect, comparison of the spectra advantageously enables a differentiated analysis of wear in the unit, wherein, on the basis of the spectrum, wear can be associated with individual components or can be traced back to individual components. A special feature is that by detecting or determining an electromagnetic spectrum of a unit which can also comprise a plurality of electrical/electronic components, it is possible to deduce the wear in the unit as a whole as well as the wear in one of the components. In this case, the electromagnetic spectrum is composed, in particular, of the electromagnetic waves emitted or generated by the corresponding components of the unit.

Preferably, according to an example embodiment of the present invention, at least one of the determined spectra is compared with a reference spectrum. This results in the advantage that wear can be reliably detected, since there is always a reference that represents a unit with no wear. In particular, the reference spectrum is a predefined, preferably simulated, ideal spectrum of the unit, which is stored, for example, in a control device of a test apparatus designed for carrying out the method according to the present invention.

In particular, the reference spectrum is used uniformly in a plurality of test procedures in which a different unit of the same type is tested in each case. This makes an advantageous standardization of the test procedure possible.

According to an example embodiment of the present invention, particularly preferably, at least one first load cycle of the test procedure is run as a reference cycle in order to determine the reference spectrum. In this respect, at the beginning of the test procedure, the reference spectrum, i.e., the spectrum of the unit in the wear-free state, is individually detected for each unit to be tested and is used as a reference for the further load cycles. As a result, an individual reference spectrum is available for each tested unit, so that the determination of wear is coordinated with individual parameters of the corresponding unit and is thus carried out particularly reliably.

In particular, according to an example embodiment of the present invention, it is provided that a plurality of reference cycles are run one after the other and an averaged reference spectrum is determined from the reference spectra determined in this way, with which reference spectrum the determined spectrum is compared. Due to the averaging, standard deviations of the spectrum, which can be present arbitrarily, for example, due to randomly occurring environmental events, such as radiation, are corrected out of the reference spectrum and are thus at least substantially no longer present in the reference spectrum. This advantageously makes it possible to determine a particularly reliable reference spectrum.

According to a preferred development of the present invention, the load cycles are predefined in such a way that the unit is operated in a full-load mode. Full-load mode is understood to mean an operation of the unit in which the unit is operated at maximum possible capacity utilization—in other words, operating parameters of the unit, such as power, multifunctionality or the like, are pushed to the maximum. This results in the advantage that, within the scope of the test procedure, weak points of the unit are reliably determined and thus a high wear resistance of the unit can be ensured. The electrical load resulting from the load cycles therefore preferably corresponds to a maximum envisaged or possible maximum load of the unit.

Alternatively, according to an example embodiment of the present invention, it is preferably provided that the load cycles are predefined such that the unit is operated in a part-load mode, wherein the electrical load corresponds to less than 70%, preferably between 30% and 70%, or exactly 50%, of the electrical load of a full-load mode. In part-load mode, the unit is therefore not operated, as described above, at maximum capacity utilization, but only with a percentage thereof. This makes possible a test procedure which is gentle on the unit and is nevertheless a reliable determination of wear.

According to an example embodiment of the present invention, the electromagnetic waves are preferably detected by means of a measuring device directly in or on at least one electrical line of the unit. Advantageously, detection of the electromagnetic waves is thereby not impaired by interference from the environment. Preferably, at least one sensing element of the measuring unit is therefore arranged in or on the electrical line, wherein in particular a test receiver, spectrum analyzer or an oscilloscope is used as the measuring unit.

In particular, it is provided that the electromagnetic waves are detected by means of an antenna device arranged at a distance from the unit. Advantageously, detection of the electromagnetic waves is thereby not impaired by interfering signals from the immediate vicinity of the unit.

Particularly preferably, according to an example embodiment of the present invention, the electromagnetic waves are detected by the antenna device not only in or on at least the electrical line but also at a distance from the unit. A particularly advantageous detection of the electromagnetic waves is thereby made possible, since the aforementioned advantages of the two measuring methods are combined for detecting the electromagnetic waves. The antenna device is preferably a part of the measuring device, so that the two aforementioned measuring methods can advantageously be carried out with the same measuring device.

A test apparatus having features of an example embodiment of the present invention has at least one device for applying at least two predefinable electrical load cycles to the unit, at least one measuring device for detecting electromagnetic waves of the unit caused by the at least two load cycles, and at least one control device which is intended for controlling the test apparatus and for evaluating the electromagnetic waves detected by the measuring device, and is characterized in that it is a control device specifically designed to carry out the method according to the present invention, as described above. This results in the advantages already mentioned in this regard.

According to a preferred development of the present invention, it is provided that the measuring device is electrically conductively connectable or connected directly to the unit and/or has an antenna device that can be arranged or is arranged at a distance from the unit. This results in the advantages already mentioned in this regard.

Preferred features and combinations of features result from what has been described above and what will be described below. The present invention is explained in more detail below with reference to the figures.

DETAILED DESCRIPTION OF EXAMPLE EMBODIMENTS

Figure 1:
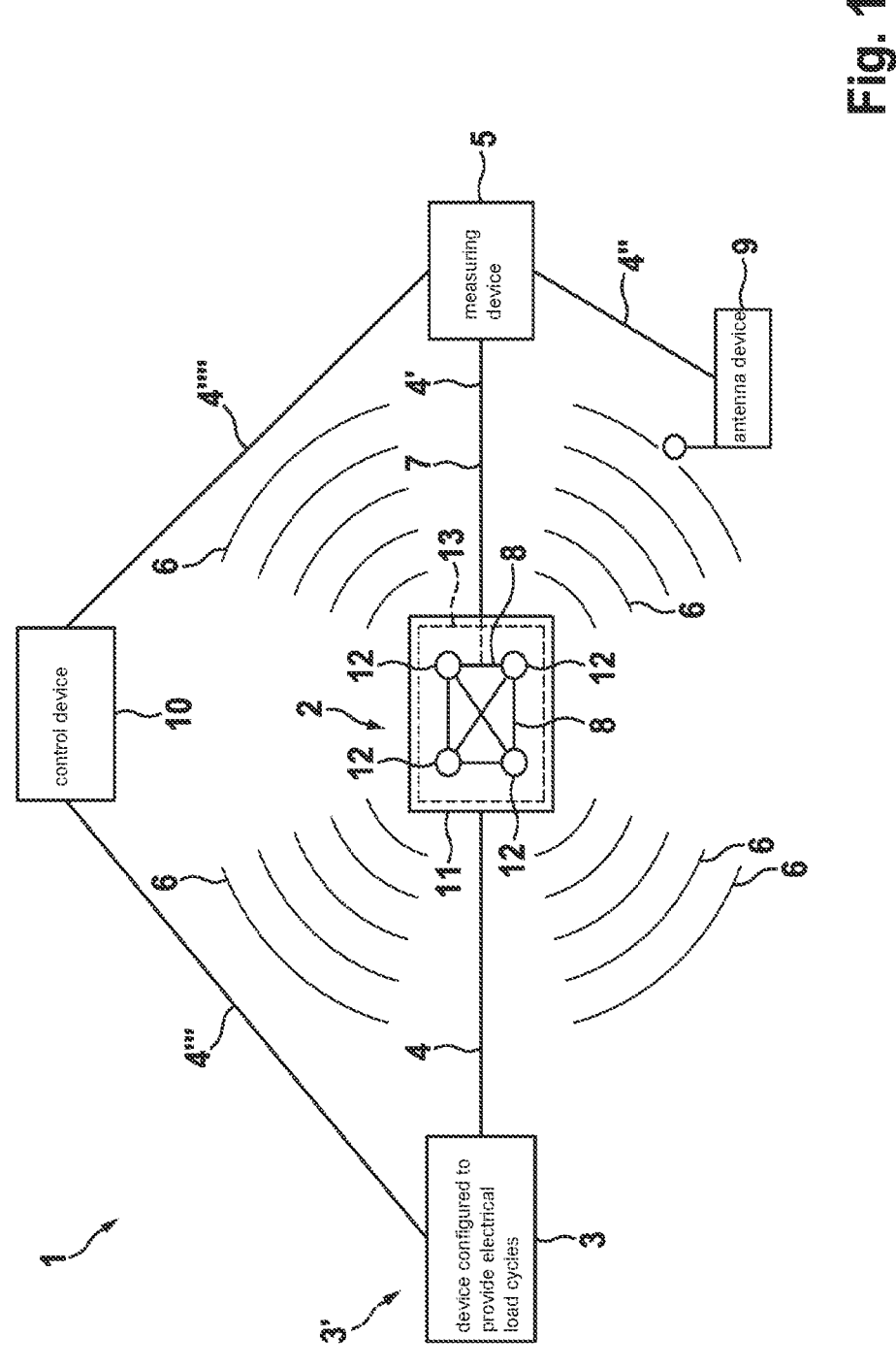
FIG. 1 is a schematic representation of an advantageous test apparatus, according to an example embodiment of the present invention.

FIG. 1 shows an advantageous test apparatus 1 in a simplified representation. The test apparatus 1 is designed to carry out an advantageous method for determining wear in an electronic unit 2, which is to be explained in more detail at a later point.

In the present case, the test apparatus 1 has a device 3 which is designed, in particular by means of at least one control command, to apply at least two electrical load cycles to the unit 2. For this purpose, the device 3 has electronic components for carrying out the load cycles, such as circuits or the like, and is electrically conductively and/or communicatively connected to the unit 2, for example by at least one cable, as shown in FIG. 1 by way of example by a first connecting line 4. Preferably, the device 3 is furthermore designed to provide a supply voltage for operating the unit 2.

In the present case, the test apparatus 1 furthermore has a measuring device 5 which is designed to detect electromagnetic waves 6 which, during operation of the unit 2, are caused by an electrical load resulting from the application of the load cycles and are emitted by the unit. For reasons of clarity, only some of the electromagnetic waves 6 are provided with a reference numeral in FIG. 1. In order to detect the electromagnetic waves 6, the measuring device 5 can be electrically conductively connected, or in the present case is electrically conductively connected, directly to the unit 2, as shown by way of example in FIG. 1 by a second connecting line 4'. Here, a sensing element 7, which is designed, for example, as a measuring sensor, is integrated into the electrical connection represented by the second connecting line 4', so that the electromagnetic waves 6 can be detected in or on at least one electrical line 8 of the unit 2. In addition, the measuring device 5 has an antenna device 9 which is arranged at a distance from the unit 2 and is designed to detect from a predefined distance the electromagnetic waves 6. The antenna device 9 is communicatively connected to the measuring device 5, either in a wired or wireless manner, as shown in FIG. 1 by a third connecting line 4".

The test apparatus 1 also has a control device 10 for controlling the test apparatus 1 and for evaluating the electromagnetic waves 6 detected by the measuring device 5. For this purpose, the control device 10 is communicatively connected, either in a wired or wireless manner, on the one hand to the device 3 and on the other hand to the measuring device 5, as schematically shown in FIG. 1 by a corresponding fourth connecting line 4''' and fifth connecting line 4'''', respectively. Preferably, the control device 10 is a programmable test device, for example a computer, which is designed in particular to control the device 3 so as to apply the at least two load cycles to the unit 2. In particular, the control device 10 has at least one data carrier for this purpose, on which a computer program or test program specifically designed for applying the load cycles to the unit 2 is stored. In this respect, the information about the way in which the at least two load cycles are to be carried out is preferably stored in the control device 10 or is contained in the computer program and can be transmitted to the device 3, which is designed to operate the unit 2 according to this information or to apply the at least two load cycles. In particular, the control device 10 is integrated into the device 3, wherein the device 3 and the control device 10 together form a test stand 3'. For example, the control device 10 and the device 3 are arranged in a common housing or designed in one piece.

In the present case, the electronic unit 2 is designed as a power electronics unit and has a housing 11 in which four electronic components 12 are arranged in the present case. In the present case, at least one of these components is designed as a semiconductor component in the form of a MOSFET (=metal oxide semiconductor field-effect transistor) or IGBT (=insulated-gate bipolar transistor) and at least one further of the components 12 as a capacitor. The components 12 are electrically connected to one another by means of electrical lines 8 of the unit 2. In particular, the components 12 are arranged on a common printed circuit board 13, which is indicated by dashed lines in FIG. 1, wherein the electrical lines 8 are preferably designed as conductor tracks of the printed circuit board 13.

Figure 2:
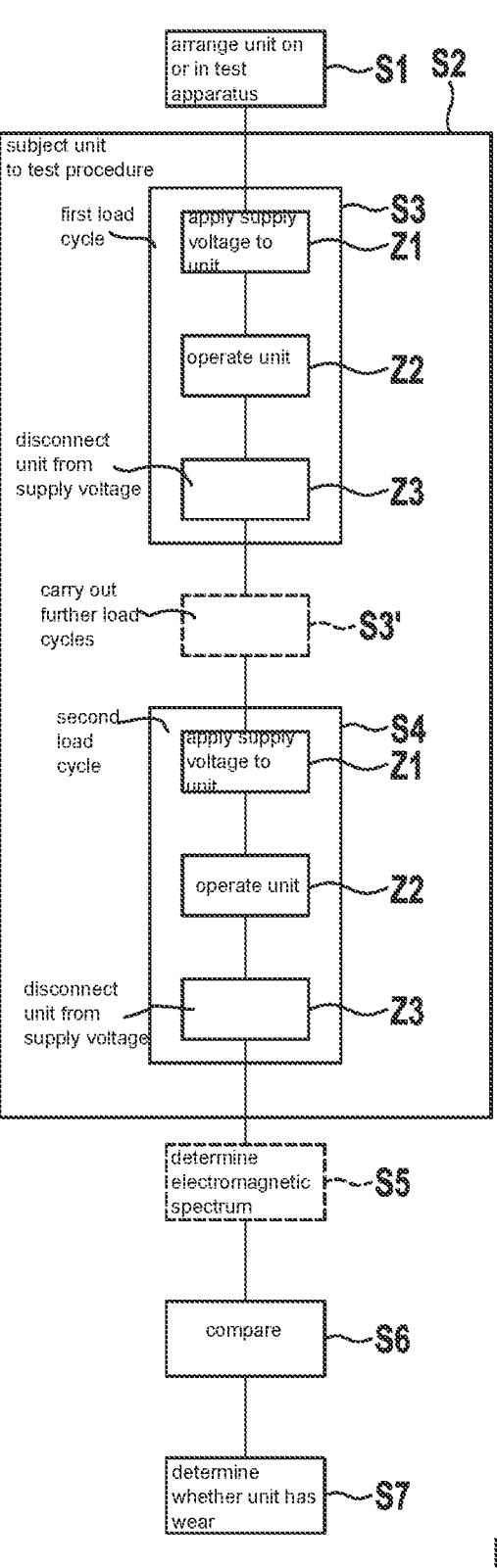
FIG. 2 is a schematic flowchart of an advantageous method, according to an example embodiment of the present invention.

The advantageous method for determining wear in the unit 2 will now be explained in more detail below. For this purpose, FIG. 2 shows a schematic flowchart of the method:

In a first step S1, the method begins with the arrangement of the unit 2 on or in the test apparatus 1, for example on a table, a support apparatus designed for supporting the unit 2, or the like. In this case, an electrical and/or communicative connection between the unit 2 and the device 3 for applying the at least two load cycles to the unit 2 is established and in addition the measuring device 5 for detecting the electromagnetic waves 6 is prepared correspondingly, i.e., in particular the sensing element 7 is electrically connected to the unit 2 or to one of its electrical lines 8, and the antenna device 9 is directed at the unit 2.

In a subsequent step S2, the unit 2 is subjected to a test procedure. Within the scope of this test procedure, the unit 2 is subjected to at least two electrical load cycles or the at least two load cycles are applied by the device 3.

In a further step S3, a first load cycle is carried out within the scope of the test procedure. Here, in a first cycle step Z1, a supply voltage provided in particular by the device 3 is applied to the unit 2 and the unit 2 is thereby operated. In a next cycle step 22, by means of at least one control command provided by the control device 10, the unit 2 is operated by the device 3 for a predefined period of time in a predefined manner or in at least one predefined operating mode. Preferably, the unit 2 is operated in at least two different operating modes. Here, the electrical waves 6 are generated by an electrical load on the unit 2 or on its components 12 resulting from the operation. In cycle step 22, these electrical waves 6 are detected by the measuring device 5. Then, in a final cycle step Z3, the unit 2 is disconnected from the supply voltage and the first load cycle is thus terminated.

Optionally, any number of further load cycles is carried out in a further step S3'.

In a next step S4, a second or final load cycle is carried out. Here, cycle steps Z1 to Z3 are carried out analogously to the first load cycle according to step S3. In general, all load cycles, i.e., also the optional load cycles according to step S3', are carried out in the same way. In this respect, the unit 2 is operated in all load cycles in the same way, i.e., with the same electrical load, for the same period of time. Preferably, the load cycles are designed in such a way, that is to say, electrical load and period of time are selected in such a way, that a load cycle simulates an intended operation of the unit 2. Preferably, the unit 2 is operated in a full-load mode in each load cycle, so that all operating parameters of the unit 2 are pushed to the maximally possible extent. Alternatively, the operation takes place during the load cycles in a part-load mode, i.e., in particular with a reduced electrical load and/or period of time.

After completion of the final load cycle carried out in step S4, the test procedure is terminated according to step S2.

In a subsequent optional step S5, an electromagnetic spectrum is determined for each load cycle from the electromagnetic waves 6, which were detected in the load cycles previously carried out. In particular, the spectra are determined by the control device 10.

In a subsequent step S6, the electromagnetic waves 6 detected in the load cycles or the spectra determined in the optional step S5 are compared with one another, i.e., evaluated by the control device 10. The determined spectra are preferably compared with a reference spectrum. The reference spectrum can be, in particular, a simulated ideal spectrum of the unit 2 that is stored in the control device 10 of the test apparatus 1, or be a reference spectrum individually determined for the tested unit 2. The reference spectrum for the tested unit 2 is preferably determined individually. In this case, it is provided that at least the first load cycle carried out in step S3 is or was carried out as a reference cycle. Particularly preferably, in the optional step S3' and following the first reference cycle according to step S3, an arbitrary number of further reference cycles are carried out one after the other and the reference spectra determined therefrom are averaged so that an averaged reference spectrum is obtained. The determination of the reference spectra and their averaging are preferably carried out in the optional step S5 or at the beginning of step S6, i.e., even before the comparison of the spectra. The spectra determined in particular from further load cycles according to step S3' and the spectra determined from the final load cycle according to step S4 are then compared with the averaged reference spectrum in step S6.

In a final step S7, it is then determined on the basis of the comparison of the detected electromagnetic waves 6 or of the determined spectra whether the unit 2 has wear.

The method described above thus enables a reliable determination of wear in the electronic unit 2 on the basis of the emitted electromagnetic waves 6, so that the functionality of the unit 2 is reliably ensured even in the long term.

The invention claimed is:

1. A method for determining wear in a power electronics unit, which includes at least one electronic component including a semiconductor component or capacitor, the method comprising the following steps:

subjecting the unit to a test procedure in which at least two predefinable electrical load cycles are applied to the unit, wherein, during the application of each of the load cycles, the unit is operated to simulate at least one selected operating mode for a predefined period of time;

during the test procedure, detecting electromagnetic waves generated by the unit by an electrical load resulting from the application of the load cycles to the unit for at least two of the load cycles;

comparing the detected electromagnetic waves of the at least two load cycles with one another;

detecting wear in the unit based on a result of the comparison.

2. The method according to claim 1, wherein an electromagnetic spectrum of each of the load cycles is determined from the electromagnetic waves of the at least two load cycles and the determined spectra are compared with one another to detect the wear.

3. The method according to claim 1, wherein characterized in that at least one of the determined spectra is compared with a reference spectrum.

4. The method according to claim 3, wherein at least one first load cycle of the load cycles of the test procedure is carried out as a reference cycle in order to determine the reference spectrum.

5. The method according to claim 4, wherein a plurality of reference cycles of the load cycles are carried out one after the other and an averaged reference spectrum is determined from the reference spectra determined using the reference cycles, and the reference spectrum is computer to the determined spectrum.

6. The method according to claim 1, wherein the load cycles are predefined such that the unit is operated in a full-load mode.

7. The method according to claim 1, wherein the load cycles are predefined such that the unit is operated in a part-load mode, wherein the electrical load corresponds to less than 70% of an electrical load of a full-load mode.

8. The method according to claim 1, wherein the electromagnetic waves are detected using a measuring device directly in or on at least one electrical line of the unit.

9. The method according to claim 1, wherein the electromagnetic waves are detected using an antenna device arranged at a distance from the unit.

10. A test apparatus for determining wear in a power electronics unit, which includes least one electronic component including a semiconductor component or capacitor, the test apparatus comprising:

at least one application device configured to apply at least two predefinable electrical load cycles to the unit;

at least one measuring device configured to detect electromagnetic waves of the unit caused by the at least two load cycles; and at least one control device configured to control the test apparatus, evaluate the electromagnetic waves detected by the measuring device, and detect wear in the electronic component based on the evaluation, wherein the at least one control device detects wear in the electronic component by comparing the detected electromagnetic waves of the at least two load cycles with one another.

11. The test apparatus according to claim 10, wherein the measuring device is electrically conductively connectable or connected directly to the unit and/or has an antenna device that can be arranged or is arranged at a distance from the unit.

* * * * *